United States Patent
Ito

(10) Patent No.: US 8,369,466 B2
(45) Date of Patent: Feb. 5, 2013

(54) AUTOMATIC GAIN CONTROL CIRCUIT, RECEIVING APPARATUS AND AUTOMATIC GAIN CONTROL METHOD

(75) Inventor: Shinya Ito, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 1232 days.

(21) Appl. No.: 12/142,052

(22) Filed: Jun. 19, 2008

(65) Prior Publication Data
US 2008/0317175 A1 Dec. 25, 2008

(30) Foreign Application Priority Data
Jun. 21, 2007 (JP) ................................. 2007-164323

(51) Int. Cl.
*H04L 27/08* (2006.01)
(52) U.S. Cl. ........ 375/345; 375/316; 330/129; 330/254; 455/234.1
(58) Field of Classification Search ............. 375/345
See application file for complete search history.

(56) References Cited

U.S. PATENT DOCUMENTS

| | | | | |
|---|---|---|---|---|
| 5,594,760 | A * | 1/1997 | Guillaud et al. | 375/345 |
| 6,011,980 | A * | 1/2000 | Nagano et al. | 455/572 |
| 6,072,998 | A | 6/2000 | Kaku | |
| 6,519,293 | B1 * | 2/2003 | Miyake | 375/297 |
| 6,668,027 | B1 * | 12/2003 | Scarpa | 375/345 |
| 7,103,336 | B1 | 9/2006 | Miyajima et al. | |
| 2002/0191717 | A1 | 12/2002 | Yamanaka et al. | |
| 2004/0147235 | A1 * | 7/2004 | Jin et al. | 455/127.1 |
| 2005/0125839 | A1 * | 6/2005 | Coman | 725/115 |
| 2005/0250462 | A1 * | 11/2005 | Wu et al. | 455/234.1 |
| 2006/0030284 | A1 | 2/2006 | Kitayama et al. | |
| 2006/0150219 | A1 * | 7/2006 | Lee et al. | 725/69 |
| 2007/0077901 | A1 * | 4/2007 | Jung | 455/127.1 |
| 2007/0200521 | A1 * | 8/2007 | Ochiai et al. | 318/376 |
| 2007/0270100 | A1 * | 11/2007 | Agrawal et al. | 455/67.11 |

FOREIGN PATENT DOCUMENTS

| | | |
|---|---|---|
| JP | 5-129862 A | 5/1993 |
| JP | 8-18469 A | 1/1996 |
| JP | 10-145250 A | 5/1998 |
| JP | 2001-77714 A | 3/2001 |
| JP | 2001-127732 A | 5/2001 |
| JP | 2002-374133 | 12/2002 |
| JP | 2006-74721 A | 3/2006 |

\* cited by examiner

*Primary Examiner* — Erin File
(74) *Attorney, Agent, or Firm* — Birch, Stewart, Kolasch & Birch, LLP

(57) ABSTRACT

An automatic gain control circuit includes: an amplification degree control section for calculating power of a digital value of a received signal, and for controlling an amplification degree of an amplifier of a receiving apparatus so that a difference between the power and predetermined reference power is zero; a received signal quality measuring section for measuring quality of the received signal; a reference power adjusting section for, upon finding that the measured quality of the received signal is below a fixed level, adjusting the reference power for a predetermined period of time; and a reference power updating section for causing the reference power adjusting section to continue to adjust the reference power until the quality of the received signal recovers to be at a predetermined recovery level or above, and for updating the reference power so that the reference power takes on an optimally adjusted value.

18 Claims, 6 Drawing Sheets

AUTOMATIC GAIN CONTROL CIRCUIT, RECEIVING APPARATUS AND AUTOMATIC GAIN CONTROL METHOD

This Nonprovisional application claims priority under 35 U.S.C. §119(a) on Patent Application No. 164323/2007 filed in Japan on Jun. 21, 2007, the entire contents of which are hereby incorporated by reference.

FIELD OF THE INVENTION

The present invention relates to automatic gain control circuits and, in particular, to an automatic gain control circuit provided in a receiving apparatus that receives an OFDM (Orthogonal Frequency Division Multiplex) signal and controls the amplitude of an input signal.

BACKGROUND OF THE INVENTION

In order to receive and demodulate a signal stably in spite of fluctuations in level of the received signal in an OFDM receiving apparatus that receives an OFDM signal, it is necessary that the amplitude of an input signal be properly controlled. In general, the amplitude of an input signal is controlled by an AGC (Automatic Gain Control) circuit that controls the amplification degree of an amplification circuit contained in a tuner provided in a receiving apparatus.

FIG. 7 is a block diagram showing a conventional OFDM receiving apparatus 100.

As shown in FIG. 7, in the OFDM receiving apparatus 101, a signal received by an antenna 102 is tuned to a desired frequency and amplified by a tuner 103. The received signal thus amplified is converted into a digital signal by an AD converter (shown in FIG. 7 as ADC: Analog to Digital Converter) 104. The digital signal is subjected to a Fourier transform process by a fast Fourier transform section (shown in FIG. 7 as FFT: Fast Fourier Transform) 105, and then subjected to a waveform equalization process by an equalizer 106. Moreover, a demapping section 107 performs a demapping process in accordance with the equalized data supplied from the equalizer 106. Furthermore, a deinterleave/forward error correction section (shown in FIG. 7 as DIL/FEC (Deinterleave/Forward Error Correction)) 108 performs a deinterleaving process and a forward error correction process, so that the received signal is demodulated into unmodulated data.

Further, the digital signal is received by an AGC section 109, and the AGC section 109 determines, in accordance with the received digital signal, such a control voltage (AGC voltage) that the input amplitude is kept at a predetermined level. The amplification degree of a variable gain amplifier contained in the tuner 103 is controlled in accordance with the control voltage.

As compared with a transmission method by which a signal sequence is carried by a single carrier wave (i.e., a single-carrier modulation method), a transmission method, such as an OFDM method, by which a signal sequence is carried by a plurality of carrier waves, has such characteristics as to exhibit much larger fluctuations in amplitude of a time-axis signal. This is because random information data on the frequency axis is subjected to inverse fast Fourier transform (IFFT) by the OFDM method.

In consideration of the above characteristics of the OFDM method, it is necessary for optimum reception conditions that the amplitude of an input signal be so controlled as not to be saturated in the AD converter 104 and as to be at a certain level of reference power superior in such qualities of a received signal as a CN (Carrier to Noise) ratio. The AGC section 109 controls the aforementioned control voltage in the tuner 103, and keeps the amplitude of the input signal at the level of the reference power. In the AGC section 109, the reference power determined at the time of designing is stored. The AGC section 109 determines the control voltage in accordance with an output obtained by making a comparison between the reference power and the input signal.

Meanwhile, since the reference power is set to be optimum in the absence of distortions or spurious components, such qualities of a received signal as a CN ratio and a bit error rate (BER) may not be optimum. A normal OFDM receiving apparatus includes means for removing spurious components and the like with use of a notch filter provided in a demodulator. However, because of the incapability of tuning to the center frequency of the notch, unexpected spurious components cannot be removed. When such spurious components having nonspecific frequencies are generated, the AGC section 109 matches power of the entire band to the reference power. As a result, in the case of a high level of spurious components, the level of a carrier wave having a frequency at which there exist no spurious components is reduced. This causes deterioration in such qualities of a received signal as a CN ratio as the level of carrier waves having other frequencies without spurious components is lowered.

In such a case as described above, such qualities of a received signal as a CN ratio may be improved by so setting the control voltage of the variable gain amplifier of the tuner 103 that the output level is higher than the reference power. In this case, although the signal amplitude may be saturated, the influence of such saturation is traded off for deterioration in level of a desired carrier waves caused by spurious components. Therefore, the performance may be improved.

Further, for such reasons that AGC designing is not perfect, that the amplification degree varies among individual devices, and that the amplification degree varies depending on use conditions such as temperature, such qualities of a received signal as a CN ratio may be improved by performing such an AGC process that the amplitude of an input signal is lower than the reference power. This indicates the possibility of improving performance by changing the reference power in accordance with such qualities of a received signal as a CN ratio and a BER.

Japanese Unexamined Patent Application Publication No. 74721/2006 (Tokukai 2006-74721; published on Mar. 16, 2006) (Document 1) discloses an OFDM demodulation circuit in which all AGC processes are determined based solely on a CN ratio. More specifically, the demodulation circuit monitors a change in CN ratio. Then, in accordance with the change, the demodulation circuit controls the control voltage of a variable gain amplifier of a tuner so that the CN ratio takes on an optimum value.

Japanese Unexamined Patent Application Publication No. 374133/2002 (Tokukai 2002-374133; published on Dec. 26, 2002) (Document 2) discloses an automatic gain control circuit which contains a circuit that monitors the HER after the end of normal AGC control of making a comparison between the power of an input signal and the reference power, and that changes the reference power so that the BER is minimized.

However, according to the demodulation circuit described in Document 1, AGC is performed by calculating the CN ratio of a signal subjected to an FFT process, so that the response of the AGC deteriorates. Moreover, a CN ratio before equalization is used, and the quality of a received signal cannot be derived accurately before equalization. As a result, the signal quality cannot be improved.

Further, according to the automatic gain control circuit described in Document 2, a BER is used as the quality of a received signal instead of a CN ratio. The BER varies in response to changes in input level; therefore, it takes time to measure the BER. As a result, at worst, a burst error occurs at a level-sweeping stage of calculating an optimum level, so that reception is interrupted. Moreover, Document 2 is completely silent about means for minimizing the BER.

According to Documents 1 and 2, in order to improve the CN ratio or the BER, an AGC operation for keeping the amplitude of an input signal at the level of reference power is constantly performed. However, in digital communication using the OFDM or the like, reception is possible as long as the quality of a received signal is at a certain level or above. Therefore, in terms of the performance, there is no advantage in performing an unnecessary AGC trial. Moreover, there is a high possibility of producing a side effect (interaction) with another type of control (e.g., control of power of a tuner according to a CN ratio). Furthermore, an unnecessary AGC trial causes an increase in power consumption.

The following explains the side effect described above. Control of power consumption of a tuner is performed depending on the reception conditions. According to this control, the power consumption of the tuner is reduced under good reception conditions so that the performance of the tuner is reduced, whereas the power consumption of the tuner is increased under poor reception conditions so that the performance of the tuner is enhanced. In other words, the performance of the tuner fluctuates depending on the reception conditions. In cases where adjustment (control) of the reference power is performed at the same time under this control, it may become impossible to distinguish whether the performance fluctuates depending on the quality of reception conditions or in response to the adjustment of the reference power. Furthermore, since the two types of control exist, there is a possibility that neither of them converges.

In cases where the performance is not high (i.e., in cases where a certain level of performance is not ensured), the power of the tuner is not controlled, and the setting for the optimum performance is maintained. Therefore, if the reference power is adjusted only in such a case, there occurs no such side effect for the power control of the tuner.

As described above, the arrangements disclosed in Documents 1 and 2 are not preferable, because AGC cannot be properly performed in accordance with the quality of a received signal.

SUMMARY OF THE INVENTION

It is an object of the present invention to provide an automatic gain control circuit in which reference power for use in AGC is updated only in the case of poor quality of a received signal so as to take on an optimum value and in which reception sensitivity can therefore be improved without interrupting reception.

In order to achieve the above object, an automatic gain control circuit of the present invention includes: an amplification degree control section for calculating power of a digital value of a received signal, and for controlling an amplification degree of an amplifier of a receiving apparatus so that a difference between the power and predetermined reference power is zero; a received signal quality measuring section for measuring quality of the received signal; a reference power adjusting section for, upon finding that the measured quality of the received signal is below a fixed level, adjusting the reference power for a predetermined period of time; and a reference power updating section for causing the reference power adjusting section to continue to adjust the reference power until the quality of the received signal recovers to be at a predetermined recovery level or above, and for updating the reference power so that the reference power takes on an optimally adjusted value.

Further, in order to achieve the above object, an automatic gain control method of the present invention includes: an amplification degree control step of calculating power of a digital value of a received signal, and for controlling an amplification degree of an amplifier of a receiving apparatus so that a difference between the power and predetermined reference power is zero; a received signal quality measuring step of measuring quality of the received signal; a reference power adjusting step of, upon finding that the measured quality of the received signal is below a fixed level, adjusting the reference power for a predetermined period of time; and a reference power updating step of causing the reference power adjusting section to continue to adjust the reference power until the quality of the received signal recovers to be at a predetermined recovery level or above, and for updating the reference power so that the reference power takes on an optimally adjusted value.

In each of the above arrangements, as the reference power adjusting section (the reference power adjusting step) that the measured quality of a received signal is below a fixed level, the reference power is adjusted for a predetermined period of time. This adjustment continues until the quality of the received signal is recovered by the reference power updating section (the reference power updating step) to be at a recovery level or above. Then, after the reference power is optimally adjusted as a result, the reference power updating section (the reference power updating step) updates the reference power so that the reference power takes on the optimum value.

As a result, the reference power for use in the amplification degree control section (the amplification degree control step) is updated only in the case of poor quality of a received signal so as to take on an optimum value, and reception sensitivity can therefore be improved without interrupting reception.

Additional objects, features, and strengths of the present invention will be made clear by the description below. Further, the advantages of the present invention will be evident from the following explanation in reference to the drawings.

DESCRIPTION OF THE EMBODIMENTS

An embodiment of the present invention will be described below with reference to FIGS. 1 to 6.

Figure 1:
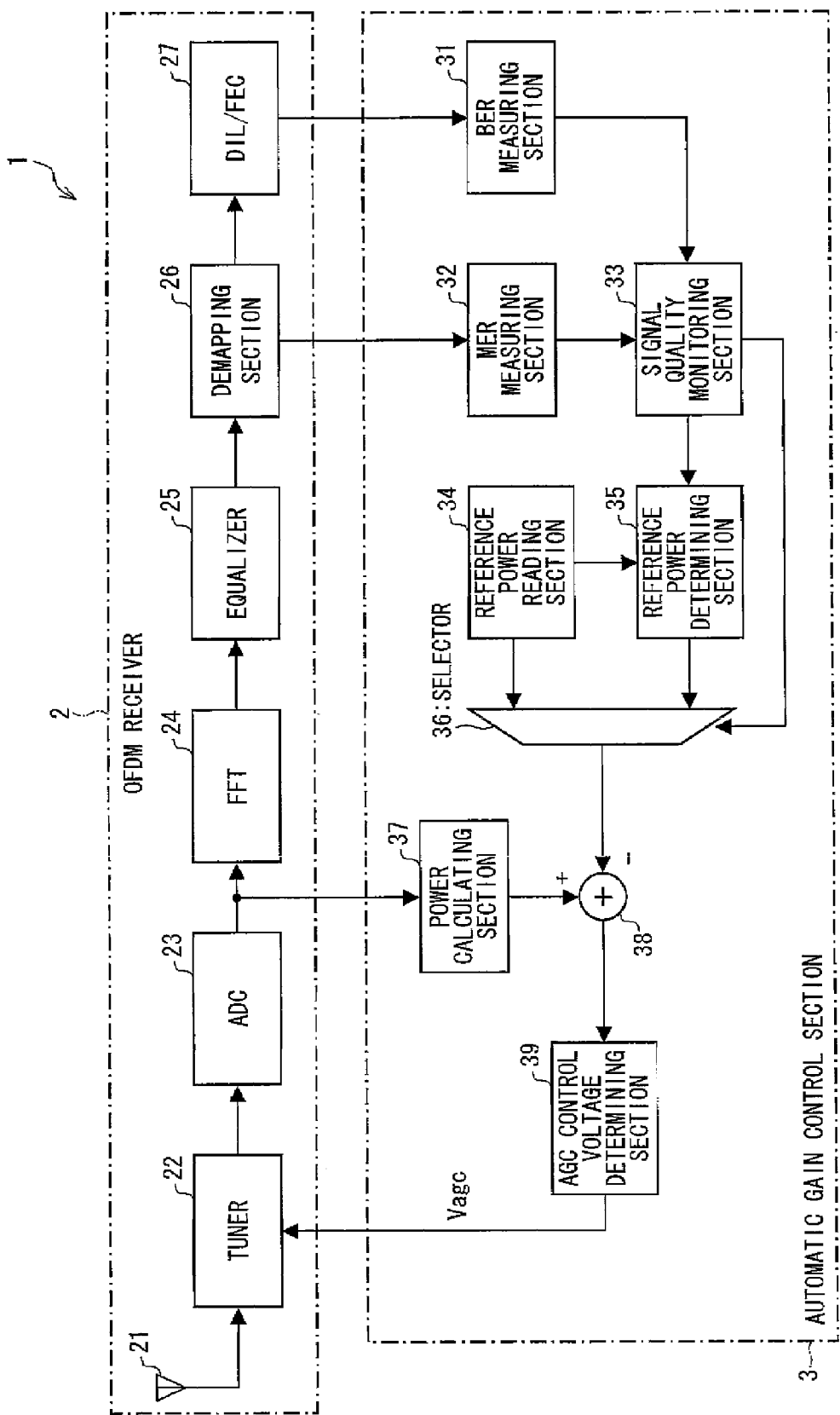
FIG. 1 is a block diagram showing an arrangement of an OFMD receiving apparatus according to an embodiment of the present invention.

FIG. 1 is a block diagram showing an arrangement of a receiving apparatus 1 according to an embodiment of the present invention.

As shown in FIG. 1, the receiving apparatus 1 includes an OFDM receiver 2 and an automatic gain control (AGC) section 3.

The OFDM receiver 2 will be described first.

The OFDM receiver 2 includes an antenna 21, a tuner 22, an AD converter 23, a fast Fourier transform section (shown in FIG. 1 as FFT) 24, an equalizer 25, a demapping section 26, and a deinterleave/forward error correction section (shown in FIG. 1 as DIL/FEC) 27.

The tuner 22 performs a tuning process by which an input signal received by the antenna 21 is tuned to a desired frequency, and amplifies the input signal. The tuner 22 contains a variable gain amplifier for amplifying an input signal. The variable gain amplifier amplifies the input signal in accordance with a gain controlled by an AGC control voltage supplied from an AGC control voltage determining section 39 described below. Therefore, the amplitude of a tuner output signal is determined by the AGC control voltage.

The AD converter 23 converts the tuner output signal into a digital signal. In the AD converter 23, the maximum input amplification acceptable to the AD converter 23 is defined.

The fast Fourier transform section 24 performs OFDM modulation by performing a Fourier transform process on the digital data supplied from the AD converter 23. As a result, the time-domain data obtained by an inverse Fourier transform process in a transmitting apparatus is converted into the original frequency-domain data.

The equalizer 25 performs a waveform equalization process on the signal outputted from the fast Fourier transform section 24. Specifically, the equalizer 25 corrects the amplitude and phase of the signal in accordance with a signal such as an SP (Scattered Pilot) signal.

In accordance with the data corrected by the equalizer 25, the demapping section 26 performs a bit test corresponding to the modulation method. Specifically, the demapping section 26 expands, into a constellation of coordinates, the data supplied from the equalizer 25, determines which coordinate point is close to which ideal signal point, and shows a result of the determination with a complex signal point vector, thereby yielding an unmodulated bit string.

The deinterleave/forward error correction section 27 performs a deinterleaving process and a forward error correction process on the output data supplied from the demapping section 26. In the deinterleaving process, the data on which an interleaving process has been performed at the time of sending are rearranged as in the original state while error correction is performed. Further, in the forward error correction process, the data lost at the time of transmission is recovered with use of the redundancy code added at the time of sending. In order to perform the forward error correction process, the deinterleave/forward error correction section 27 contains a section that performs Reed-Solomon decoding (a Reed-Solomon decoding section). The Reed-Solomon decoding section performs error correction for each block of data.

The following describes the automatic gain control section 3.

The automatic gain control section 3 includes a BER measuring section 31, an MER measuring section 32, a signal quality monitoring section 33, a reference power reading section 34, a reference power determining section 35, a selector 36, a power calculating section 37, a power difference calculating section 38, and an AGC control voltage determining section 39.

The BER measuring section 31 calculates a BER by counting the number of blocks whose errors have been corrected by the Reed-Solomon decoding section of the deinterleave/forward error correction section 27.

The MER measuring section 32 outputs a modulation error ratio (MER) in accordance with the constellation obtained as a result of the demapping performed by the demapping section 26. Specifically, the MER measuring section 32 detects the number of vector errors the demapped complex signal point vector contains with respect to the ideal signal points, and outputs an MER as a value indicative of a power ratio between the ideal signal point vector and the error vector. In other words, the MER is a CN ratio calculated from the constellation after demapping.

The signal quality monitoring section 33 monitors the BER measured by the BER measuring section 31 and the MER measured by the MER measuring section 32. When the MER is below a predetermined level as a quality of the received signal, the signal quality monitoring section 33 instructs the reference power determining section 35 to adjust the reference power. Further, when the MER is at the predetermined level or above, the signal quality monitoring section 33 controls the selector 36 so that the selector 36 selects an output of the reference power reading section 34. Alternatively, when the MER is below the predetermined level, the signal quality monitoring section 33 controls the selector 36 so that the selector 36 selects an output of the reference power determining section 35.

Figure 2:
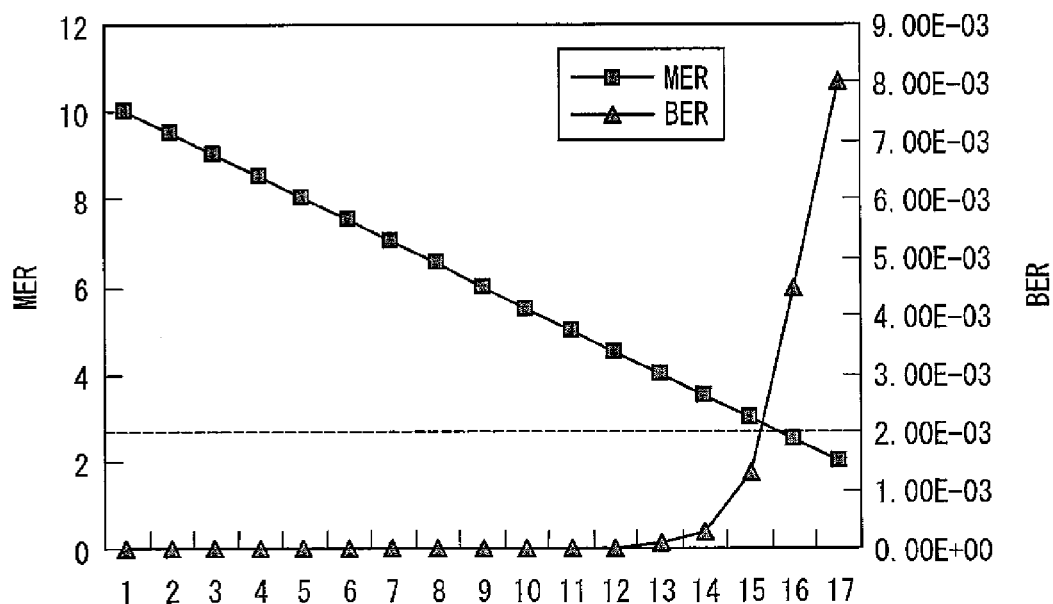
FIG. 2 is a graph explaining an MER and an BER measured in an automatic gain control section of the receiving apparatus.

The differences in characteristics between the MER and the BER will be described below with reference to FIG. 2. FIG. 2 shows a DVB-H example of respective characteristics of MER and BER with respect to signal quality under Gaussian channel conditions.

As shown in FIG. 2, as the X-axis value becomes smaller, the input signal quality becomes better. As the X-axis value becomes larger, the input signal quality becomes worse. Shown on the left side of the Y axis is MER in dB. As the MER takes on a larger value, the signal quality becomes better. Shown on the right side of the Y axis is BER. As the BER takes on a larger value, the number of bit errors becomes larger, in which case the signal quality becomes worse. Further indicated by the dotted line in FIG. 2 is a threshold. If the BER becomes higher than this level, reception becomes impossible.

As shown in FIG. 2, the BER does not make it possible to comprehend signal quality in a wide range. This is because a signal at a certain level of quality becomes error-free since error correction is performed in digital broadcasting. On the other hand, the MER makes it possible to comprehend signal quality in a wide range. Considering that it takes time to measure the BER, it is more likely, as compared with the MER, that the signal quality is reduced to such an extent that reception becomes impossible by the time the next measurement result is obtained. This makes it difficult to set a proper threshold by using the BER alone.

On the other hand, when control based on the MER is performed, it not only takes a shorter time for measurement, but also makes it possible to comprehend signal quality in a wider range. Therefore, finer control can be performed at high speeds as compared with the BER. However, the BER shows the final quality of a signal, whereas the MER depends on the channel environment. For example, the MER supposed be error-free problematically varies depending on a change in Doppler frequency caused by a movement speed. Specifically, under Gaussian channel conditions, the BER is 0, when the MER is 5 dB. However, in cases where the receiving apparatus 1 is moving at a speed of 50 km/h, there is possibility that the BER is 0.01 when the MER is 5 dB.

Therefore, under normal conditions, the control based on the MER is performed without problems. However, in cases where the channel environment goes beyond expectation or the threshold is set without a sufficient margin, there is a possibility of causing a problem in accuracy with which the control based on the MER is performed.

Accordingly, the signal quality monitoring section 33 performs control of: monitoring signal quality with use of the MER; performing basic AGC in accordance with this value; in cases where the BER is so bad that reception is about to become impossible (i.e., in cases where the BER is at the predetermined threshold or above), suspending a trial operation for reference power adjustment; and resetting the automatic gain control section 3 after the BER recovers to the state in which reception is possible.

The reference power reading section 34 reads out defined reference power stored beforehand in a predetermined storage region, and outputs the reference power to the reference power determining section 35 and the selector 36.

The reference power determining section 35 increases and decreases, in accordance with a result of evaluation of signal quality by the signal quality monitoring section 33, the reference power read out by the reference power reading section 34, thereby adjusting the reference power in order to determine an optimum reference power.

The selector 36 is a circuit that selects and outputs either the reference power read out by the reference power reading section 34 or the reference power determined by the reference power determining section 35. This selector 36 carries out the selection in accordance with the control performed by the signal quality monitoring section 33.

The power calculating section 37 calculates tuner output power in accordance with the digital value of the tuner output signal of the AD converter 23.

The power difference calculating section 38 subtracts, from the power calculated in the power calculating section 37) the predetermined reference power read out by the reference power reading section 34 and outputted via the selector 36, and outputs the difference between the two types of power.

The AGC control voltage determining section 39 performs control of adjusting an AGC control voltage Vagc so that the power difference calculated by the power difference calculating section 38 converges to zero. The AGC control voltage determining section 39 adjusts the control voltage so that the control voltage is at such a signal level that the influence of quantization and the like is minimized and the signal quality is improved within the defined range of maximum input amplitude acceptable to the AD converter 23.

It should be noted that the automatic gain control section 3 includes a plurality of circuit components. Unless otherwise stated below, each of the circuit components may be a group of circuit elements specialized to perform respective independent functions, or may be a combination of a general-purpose processor or the like and a program designed to drive hardware such as a processor to perform each function described below. In the latter case, each of the circuit components is constructed by combining hardware and a program.

A process of trial for reference power adjustment performed by the automatic gain control section 3 as described later is achieved by executing the program. The program is stored in a predetermined storage medium, and retrieved from the storage medium when executed.

Further, in any case, the stored program is preferably executed when accessed by a processor. Moreover, the retrieved program is preferably downloaded to a program storage area of a microcomputer and then executed. It should be noted that the program to be downloaded is stored beforehand in the main device.

The program may be stored in and distributed by a computer-readable storage medium such as a removable storage media or a fixed storage medium. Examples of the removable storage medium include CD-ROMs (Compact Disc Read Only Memory), flexible disks (FD) and MO (Magneto Optical) disks, and examples of the fixed storage medium include hard disks. The program may also be distributed via a communication network such as the Internet by cable or wireless telecommunications means. Further, this program does not need to be dedicated to automatic gain control, and may be such a program for, when used in combination with a program for a demodulation process, causing a general-purpose device containing a general-purpose processor or the like to function as a receiving apparatus. The program medium may also be a memory (not shown), such as a ROM, for the purpose of performing a process in a microcomputer. Alternatively, the program medium may be read by inserting a storage medium into a program reader (not shown) provided as an external storage device.

The following describes the operation of the receiving apparatus 1 arranged as described above.

First, a signal inputted from the antenna 21 is converted into an IF (Intermediate Frequency) signal by the tuner 22, and is further converted into a digital signal by the AD converter 23 so as to be at a constant signal level. Then, the Fourier transform section 24 performs OFDM demodulation on the digital data supplied from the AD converter 23.

After that, the equalizer 25 corrects the amplitude and phase of the demodulated signal in accordance with an SP (Scattered Pilot) signal and the like. The signal thus corrected is demapped on an IQ plane by the demapping section 26. The signal thus demapped by the demapping section 26 is then subjected to a deinterleaving process and a forward error correction process by the deinterleave/forward error correction section 27. At this stage, the signal is normally an MPEG2-TS signal.

In cases where the automatic gain control section 3 performs a normal AGC process, the reference power reading section 34 reads out the predetermined reference power, and the predetermined reference power is outputted via the selector 36. Meanwhile, the power calculating section 37 calculates tuner output power from the output supplied from the AD converter 23. Then, the power difference calculating section 38 calculates a difference between the reference power and the tuner output power. Then, the AGC control voltage determining section 39 controls the AGC control voltage Vagc so that the output (difference) supplied from the power difference calculating section 38 converges to zero.

This is a normal AGC process. Immediately after the start of reception, symbol synchronization is not achieved. This is because of the absence of a lock such as AFC (Automatic Frequency Control). Therefore, the OFDM receiver 2 cannot normally receive a signal. In this state, the normal AGC is performed without conducting a trial for reference power adjustment.

At this stage, although not shown, the signal quality monitoring section 33 finds, in accordance with various input lock signals, that no signal is received, e.g., that AFC is not locked. Then, the signal quality monitoring section 33 controls the selector 36 so that selector 36 outputs the reference power read out from the reference power reading section 34.

This makes it possible to avoid such a problem that the quality of a received signal is not acquired and automatic gain control does not function normally in such a situation in which no symbol synchronization is achieved. In such a situation, there occurs deadlock between the automatic gain control and the measurement of the quality of a received signal. Therefore, at the start of reception or at the time of resumption of reception, it is necessary to perform normal control (AGC) of the amplification degree solely in accordance with the amplitude level of an input signal, and to perform an operation of expanding the coverage (sensitivity) during reception.

After a series of initial operations as described above, the MER and the BER become measurable when the AGC has converged and when reception is achieved without problems related to all the locks such as the AFC. In view of this, as described above, the BER measuring section 31 calculates the BER by counting the number of blocks whose errors have been corrected by the deinterleave/forward error correction section 27. Further, the MER measuring section 32 calculates the MER from the constellation obtained as a result of the demapping performed by the demapping section 26.

The signal quality monitoring section 33 monitors the MER as the quality of a received signal. When the MER is judged as sufficiently high, the signal quality monitoring section 33 controls the selector 36 so that the selector 36 selects the value read out from the reference power reading section 34. As described later, in such a period that the quality of a received signal is judged as low by the signal quality monitoring section 33, the reference power determining section 35 conducts a trial for sweeping (changing) the reference power up and down. Moreover, at this stage, the signal quality monitoring section 33 controls the selector 36 so that the selector 36 selects the reference power determined by the reference power determining section 35.

Figure 3:
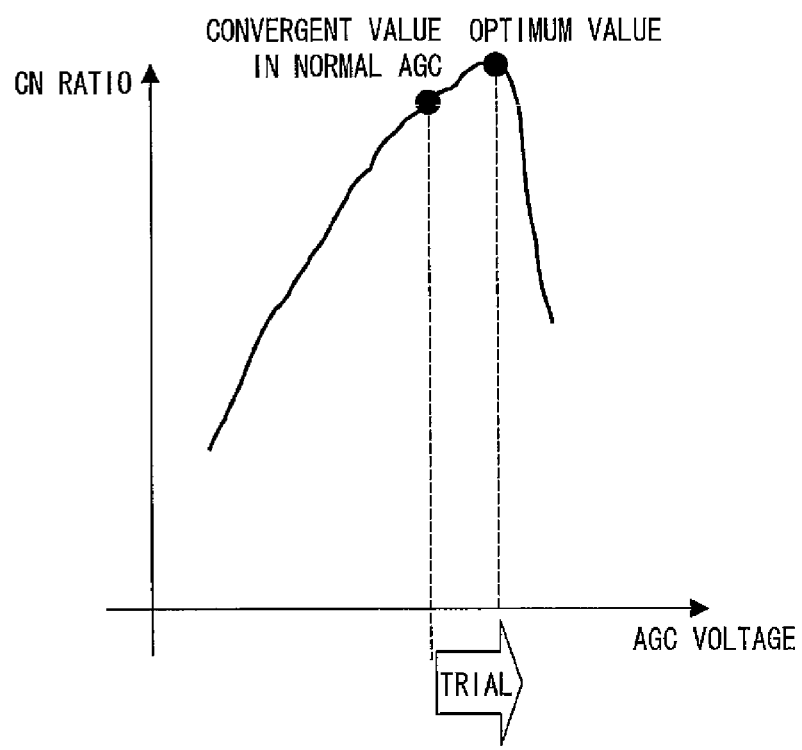
FIG. 3 is a graph showing a relationship between an AGC control voltage and a CN ratio as established at the time of conducting a trial for reference power adjustment in an AGC process performed by the automatic gain control section.

This causes the AGC control voltage determining section 39 to adjust the AGC control voltage Vagc so that the difference between the value obtained by changing the predetermined reference power and the input power (tuner output power) becomes zero. The control makes it possible, as shown in FIG. 3, to dynamically and instantaneously calculate optimum reference power that yields a higher CN ratio than reference power that is based on normal AGC. By thus performing AGC with use of the reference power optimally adjusted in accordance with the MER, the quality of a received signal is improved.

Figure 4:
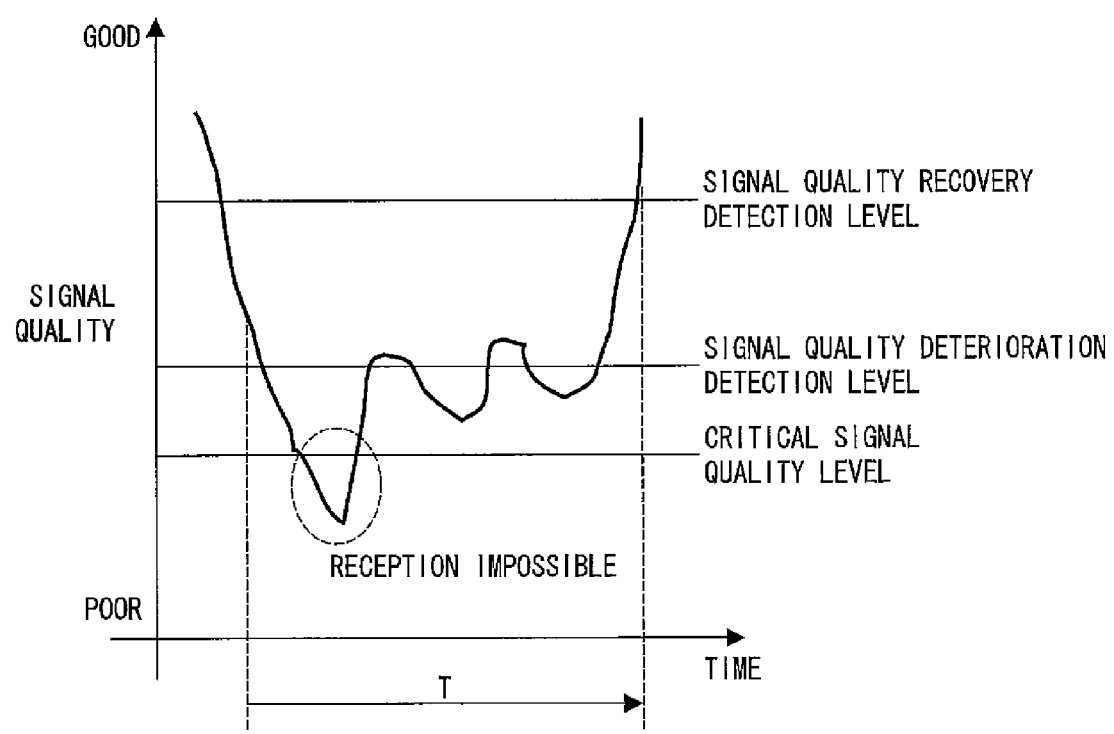
FIG. 4 is a graph showing a threshold at which a signal quality monitoring section of the automatic gain control section detects deterioration in signal quality.

A period during which the quality of a received signal is low, i.e., a period between detection of deterioration in quality of a received signal and detection of recovery of the quality of a received signal is determined beforehand as shown in FIG. 4. In the example shown in FIG. 4, while the signal quality deterioration detection level is set, the signal quality recovery detection level is set so as to fall within a range above the signal quality deterioration detection level. The signal quality deterioration detection level is a threshold at which deterioration in quality of a received signal is detected in a range above the critical signal quality level at which it is determined whether reception is achieved or not. In the above setting, the quality of a received signal is measured with hysteresis characteristics. This prevents a reference power adjustment trial from being interrupted because of a temporary result.

Further, the above threshold is predetermined for each modulation method or code rate, and selected by the reference power determining section 35 in accordance with a control signal contained in the received signal. Examples of the control signal include a TMCC (Transmission and Multiplexing Configuration Control) signal conforming to ISDB (Integrated Services Digital Broadcasting-Terrestrial) and a TPS (Transmission Parameter Signaling) signal conforming to DVB-H.

It is preferable that the signal quality monitoring section 33 preferably reads, as the threshold, an individual threshold stored beforehand in a memory in accordance with modulation method information or code rate information extracted from a control signal such as the TMCC or TPS signal, and uses the threshold for determining the quality of the received signal. This makes it possible to automatically choose an optimum threshold even when the receiver is used in an area where different methods are used as in the case of roaming or the like.

When a result obtained by measuring the MER for such a short period of time as a single symbol period is used as the quality of a received signal, the symbol period needs to be synchronized with a trial period so that the MER measuring section 32 can measure a symbol corresponding to the trial period. Further, in order to minimize the influence of deterioration in quality of a received signal caused by failure in a reference power adjustment trial, it is usual to perform a trial and MER measurement for a short period when the signal quality is not less than the critical signal quality, and to thereby lower the time ratio of a trial period. By lowering the time ratio, the influence of failure in the reference power adjustment trial may be diffused by time interleaving, symbol interleaving, virtual time interleaving conforming to MPE-FEC and the like in digital broadcasting and the like. This makes it possible to minimize the amount of deterioration in quality of a received signal caused by failure in a trial.

For example, after a trial for increasing or decreasing reference power only in one symbol period out of 100 symbols, an AGC process is performed in the residual 99 symbols with use of the reference power with which improvement in the MER was confirmed in the previous trial. And if there occurs improvement in the MER as a result of MER measurement performed in the trial symbol period, an AGC process is performed also in the other trial periods with use of the reference power used in the trial symbol period.

In order to obtain the quality of a received signal more accurately, the same trial as described above may be repeated to confirm the result.

Figure 5:
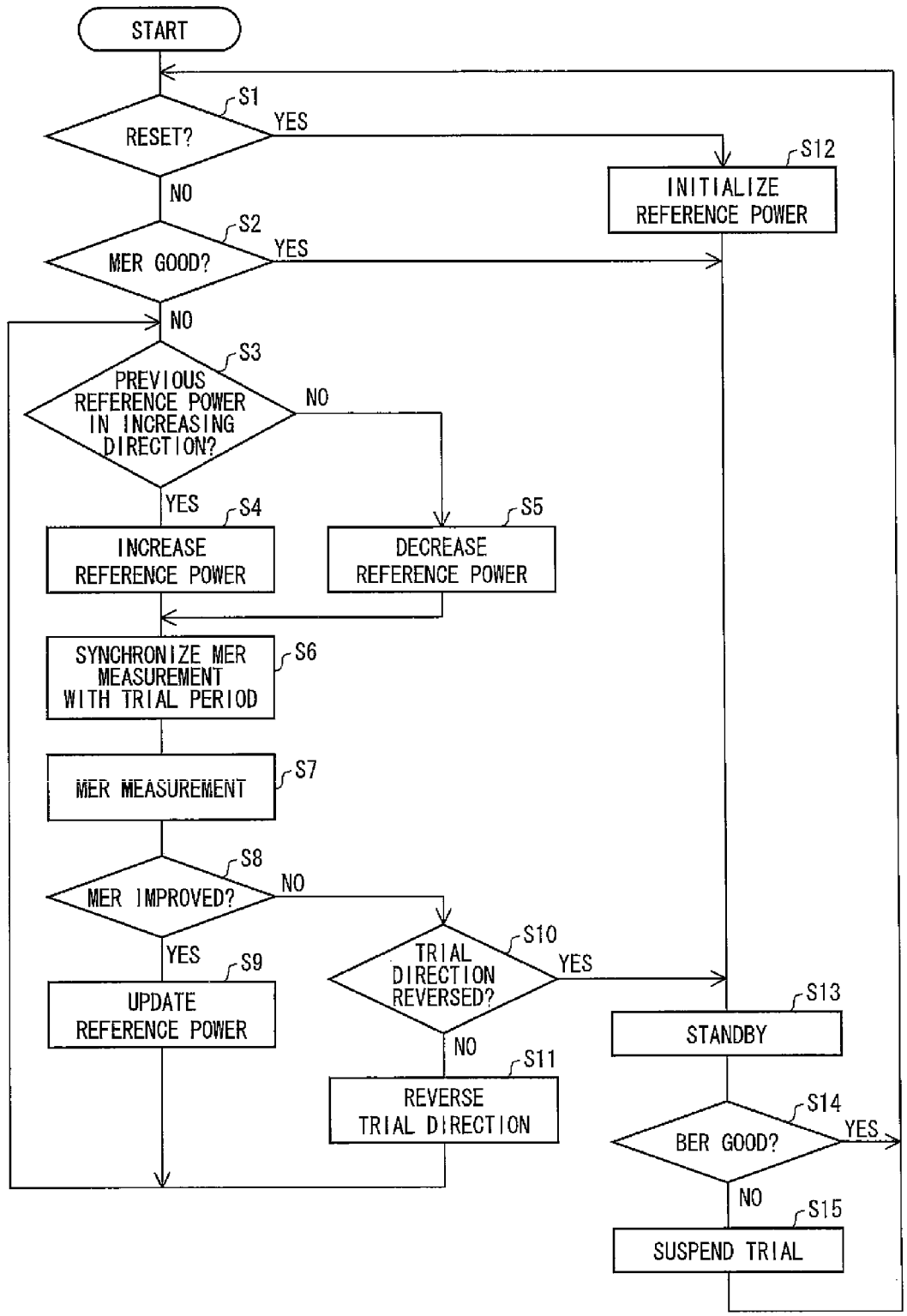
FIG. 5 is a flow chart showing steps of a trial process by which the automatic gain control section adjusts reference power.

In the following, steps of a process by which the automatic gain control section 3 conducts a trial for reference power adjustment will be described with reference to FIG. 5.

First, it is determined whether or not the system is reset (Step S1). This reset is performed by a processor that controls the operation of the automatic gain control section 3.

When it is determined in Step S1 that the reset is not performed, the MECR is compared with the aforementioned threshold (the signal quality deterioration detection level), so that it is determined whether or not the MER is lower than the threshold (whether the MER is good or not) (Step S2). This determination is made by the signal quality monitoring section 33.

When it is determined that the MER is not good, it is determined whether or not the trial direction for reference power adjustment was an increase direction in the previous trial for reference power adjustment (Step S3). It should be noted, however, that the "trial direction of for reference power adjustment" refers to a direction in which the MER improved in the previous trial and does not necessarily refer to the immediately preceding trial direction. As a result, information on the quality of a signal received in the past can be utilized for prediction of a trial direction.

In cases where the previous trial direction is a direction in which the reference power is increased, the reference power is increased (Step S4). On the other hand, in cases where the previous trial direction is a direction in which the reference power is decreased, the reference power is decreased (Step S5). After the Steps S4 or S5, the MER measurement period is synchronized with the trial period (Step S6).

Steps S3 to S6 are performed by the reference power determining section 35.

Then, the MER measuring section 32 performs MER measurement in the trial period (Step S7).

After that, the signal quality monitoring section 33 determines whether or not the MER has improved in the trial period as compared with the previous trial period (Step S8). In cases where it is determined that the MER has improved, the reference power determining section 35 updates the reference power for the next time (Step S9). At the same time, the reference power determining section 35 updates the reference power for periods other than the trial period, and the process shifts back to Step S3. After that, the series of steps in the process loop is repeated until no more improvement occurs in the MER.

In cases where it is determined in Step S8 that the MER has not improved, it is determined whether or not the trial direction for reference power adjustment has already been reversed by the reference power determining section 35 (Step S10). In cases where it is determined that the trial direction has not been reversed yet, the trial direction is reversed by the reference power determining section 35 (Step S11). For example, when the previous trial direction is a direction in which the reference power is increased, the direction is reversed for the next time and later so that the reference power is decreased. After that, the process shifts back to Step S3. Then examined is the received signal quality of a received signal as obtained as a result of (i) the adjustment of the reference power in the reversed trial direction and (ii) the AGC process performed with use of the adjusted reference power.

In cases where it is determined in Step S10 that the trial direction has already been reversed, the transmission channel is considered to be in such poor conditions that no recovery is made for the time being, and the system stays on standby for a certain period of time (Step S13).

Further, in cases where it is determined in Step S2 that the MER is good, reception can be sufficiently achieved without a trial for reference power adjustment, and thus the process proceeds to Step S13, Further, in cases where it is determined in Step S1 that the reset is performed, the trial reference power is set as reference power for use in normal AGC by a process of initializing trial reference power, and the initial trial direction is set in default (Step S12). Then, the process proceeds to Step S13. The default initial trial direction may be either a direction in which to increase the reference power or a direction in which to decrease the reference power. However, for the purpose of alleviating the influence of spurious components or the like, it is preferable for the following reason that the direction be set to be a direction in which to increase the reference power.

When there exist large spurious components in the desired spectrum, the level of the entire desired spectrum is determined by the spurious level. Therefore, in a normal AGC process, such control is performed that the spurious level becomes an optimum level for AD conversion. In other words, the level of the originally desired wave (carrier) is lower than the optimum level. In this case, an attempt to further increase the level by AGC may make it possible to improve the CN ratio by raising the desired wave (carrier) level. However, when the level becomes excessively large, there is such a trade-off that deterioration in performance is caused by saturation reached in the AD conversion due to the spurious components. Therefore, the level may not be increased unlimitedly.

The foregoing reason may be rephrased as follows. In such multi-carrier transmission as OFDM, only several carriers are afflicted by spurious components. Therefore, the influence on the entire carriers (normally thousands of carriers) is small. However, by performing an AGC process in accordance with this spurious power, such a problem may be posed that the signal levels of the residual thousands of carriers are reduced as a result. In such a case, it is preferable that the default initial trial direction be a direction in which to increase the reference power.

As described above, basically, the quality of a signal is monitored with use of an MER, and is improved by performing an AGC process in accordance with the value. Therefore, after Step S13, the process may shift back to Step S1 without performing Steps S14 and S15. However, in cases where the BER is so bad that reception is about to become impossible (i.e., in cases where the BER is at the predetermined threshold or above), it is preferable, as described above, to perform control of suspending a trial operation for reference power adjustment and resetting the automatic gain control section 3 after the BER recovers to the state in which reception is possible.

Such a trial for reference power adjustment as described above is conducted by the reference power determining section 35 in accordance with a result of evaluation of signal quality carried out by the signal quality monitoring section 33. Initially, the predetermined reference power stored in the reference power reading section 34 is transferred to the reference power determining section 35, and a value obtained by adding or subtracting a certain amount to or from that value is used as reference power. After that, a value obtained by adding or subtracting a certain amount to or from the previous trial result is used as trial reference power.

As described above, in the receiving apparatus 1 according to the present embodiment, the automatic gain control section 3 performs a trial for reference power adjustment with use of an MER that can be measured at high speeds, so that the influence of the trial can be minimized with interleaving and error correction of digital broadcasting. An instantaneous error is diffused by interleaving, and therefore can be sufficiently corrected. This makes it unlikely for reception to be interrupted due to a reference power adjustment conducted based on a BER.

Also, even under such conditions that there is a difference in result of evaluation of signal quality between the MER and the BER, erroneous reference power control based on the MER can be interrupted by providing a confirmation step that is based on the BER. It is always true that the signal quality is good as long as the MER is good. However, it cannot be determined at which level the MER should be so that the received signal starts to be error-free, i.e., so that the BER starts to be also good. Therefore, it is preferable to provide the confirmation step that is based on the BER.

Figure 6:
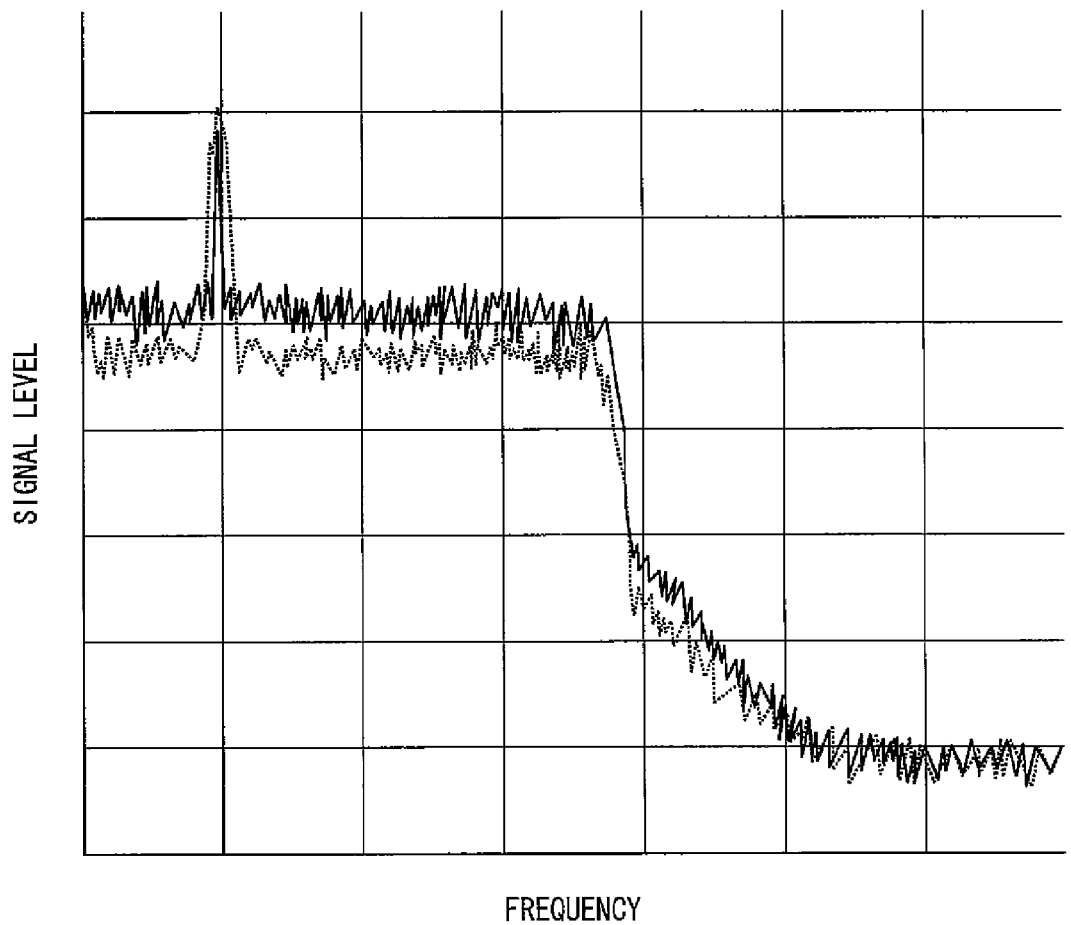
FIG. 6 is a graph showing signal levels adjusted as a result of the AGC process performed by the automatic gain control section.
Figure 7:
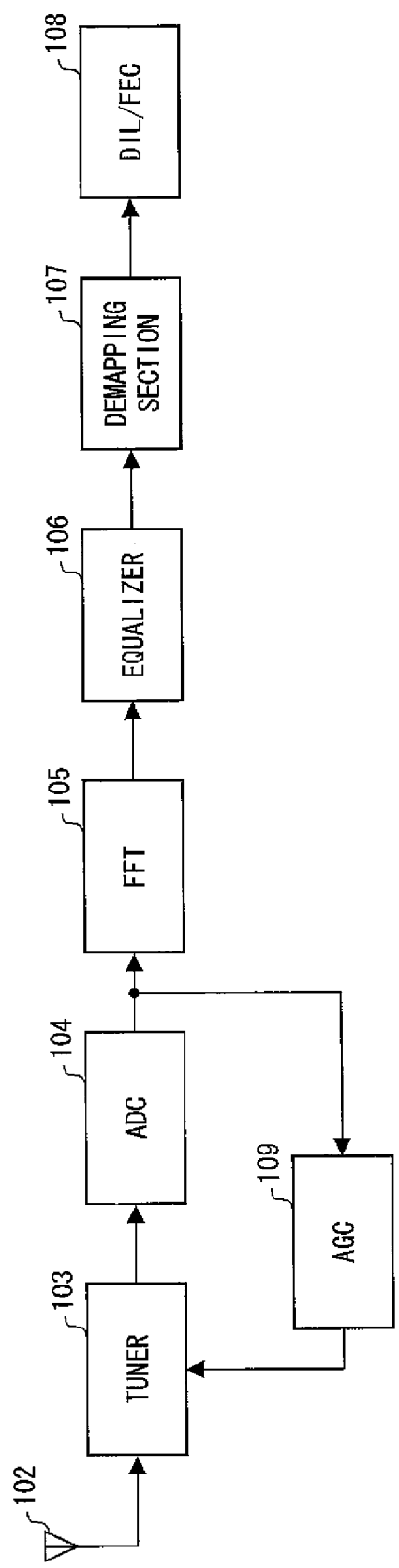
FIG. 7 is a block diagram showing an arrangement of a conventional OFDM receiving apparatus.

When an AGC process is performed based on the reference power obtained from the result, it is possible that as indicated by the solid line in FIG. 6, the signal level is raised above the normal level indicated by the dotted line.

Finally, the present embodiment will be summarized.

An automatic gain control circuit in accordance with an embodiment of the present invention includes: an amplification degree control section for calculating power of a digital value of a received signal, and for controlling an amplification degree of an amplifier of a receiving apparatus so that a difference between the power and predetermined reference power is zero; a received signal quality measuring section for measuring quality of the received signal; a reference power adjusting section for, upon finding that the measured quality of the received signal is below a fixed level, adjusting the reference power for a predetermined period of time; and a reference power updating section for causing the reference power adjusting section to continue to adjust the reference power until the quality of the received signal recovers to be at a predetermined recovery level or above, and for updating the reference power so that the reference power takes on an optimally adjusted value.

Also, an automatic gain control program in accordance with an embodiment of the present invention causes a computer to function as: an amplification degree control section for calculating power of a digital value of a received signal, and for controlling an amplification degree of an amplifier of a receiving apparatus so that a difference between the power and predetermined reference power is zero; a received signal quality measuring section for measuring quality of the received signal; a reference power adjusting section for, upon finding that the measured quality of the received signal is below a fixed level, adjusting the reference power for a predetermined period of time; and a reference power updating section for causing the reference power adjusting section to continue to adjust the reference power until the quality of the received signal recovers to be at a predetermined recovery level or above, and for updating the reference power so that the reference power takes on an optimally adjusted value.

Each of the automatic gain control circuit and the automatic gain control program performs proper automatic gain control corresponding to the quality of a received signal. This makes it possible to improve reception performance without interrupting reception.

As described above, the automatic gain control circuit of the present embodiment optimally adjusts, in accordance with the quality of a received signal, the reference power based on which an AGC process is performed. This makes it possible that reference power for use in AGC is updated only in the case of poor quality of a received signal so as to take on an optimum value, and that sensitivity is therefore improved without interrupting reception. Therefore, the automatic gain control circuit can be suitably used in an OFDM receiving apparatus.

In the above automatic gain control circuit, the received signal quality measuring section uses an MER as the quality of the received signal. As a result, since the MER can be measured in a short period of time, it is possible to improve reception performance in a short period of time.

In the above automatic gain control circuit, it is preferable that the received signal quality measuring section use a bit error rate (BER) as the quality of the received signal and, when the bit error rate takes on a predetermined reference value or higher, the reference power adjusting section temporarily stop adjusting the reference power. By using not only the MER but also the bit error rate as the quality of a received signal, it becomes possible to use such characteristics of the BER that the quality of a received signal can be measured with high accuracy. This makes it possible to further improve reception performance. Further, when the BER is at the predetermined standard value or above, it is highly possible that reception is about to become impossible. Therefore, the operation of adjusting the reference power is suspended.

In the above automatic gain control circuit, in determining (i) whether the quality of the received signal is below the fixed level and (ii) whether the quality of the received signal has recovered to be at the recovery level or above, the reference power adjusting section refers to a threshold having hysteresis characteristics. This prevents the reference power adjustment from being stopped due to an instantaneous improvement in the quality of the received signal. This makes it possible to improve reception performance more stably.

In the above automatic gain control circuit, the reference power adjusting section reads, as the threshold, an individual threshold stored beforehand in accordance with modulation method information or coding rate information extracted from a control signal contained in the received signal, and uses the threshold for determining the quality of the received signal. This makes it possible to automatically choose an optimum threshold even when a receiver is used in an area where different methods are used as in the case of roaming or the like.

In the above automatic gain control circuit, the reference power adjusting section synchronizes, with the period in which the reference power is adjusted, a symbol period to be measured by the received signal quality measuring section. This makes it possible to measure the quality of the received signal in correspondence with the period in which the reference power is adjusted. Therefore, the quality of the received signal can be measured accurately even in a short period of adjustment.

In the above automatic gain control circuit, the reference power adjusting section stores a direction in which quality of a received signal improved at a time of previous adjustment, and chooses an initial adjustment direction in accordance with the direction in determining whether to adjust the reference power in an increasing direction or in a decreasing direction. As a result, the time in which the process of adjusting the reference power is terminated may be shortened by predicting an initial adjustment direction in accordance with information about the previous adjustment. Since the adjustment time is shortened, the influence of reference power adjustment on reception performance can be reduced.

In the above automatic gain control circuit, upon finding that the receiving apparatus is incapable of receiving a signal, the reference power adjusting section stops adjusting the reference power and provides the amplification degree control section with the predetermined reference power. In a situation where symbol synchronization is not achieved, the receiver cannot receive a signal. Therefore, the quality of a received signal cannot be obtained. Further, in such a situation, there occurs deadlock between the automatic gain control and the measurement of the quality of a received signal. In response to this situation, the above arrangement makes it possible to avoid such a problem that the automatic gain control does not operate properly. Therefore, at the start of reception or at the time of resumption of reception, normal control (AGC) of the amplification degree is performed solely in accordance with the amplitude level of an input signal by providing the amplification degree control section with the predetermined reference power.

It should be noted that the automatic gain control program may be stored in a computer-readable storage medium.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. An automatic gain control circuit comprising:
an amplification degree control section for calculating power of a digital value of a received signal, and for controlling an amplification degree of an amplifier of a receiving apparatus so that a difference between the power and predetermined reference power is zero;
a received signal quality measuring section for measuring quality of the received signal;
a reference power adjusting section for, upon finding that the measured quality of the received signal is below a fixed level, adjusting the reference power for a predetermined period of time; and
a reference power updating section for causing the reference power adjusting section to continue to adjust the reference power until the quality of the received signal recovers to be at a predetermined recovery level or above, and for updating the reference power so that the reference power takes on an optimally adjusted value,
wherein the reference power adjusting section reads, as the fixed level and the predetermined recovery level, an individual threshold stored beforehand in accordance with modulation method information or coding rate information extracted from a control signal contained in the received signal, and uses the threshold for determining the quality of the received signal.

2. The automatic gain control circuit according to claim 1, wherein the received signal quality measuring section uses a modulation error rate as the quality of the received signal.

3. The automatic gain control circuit according to claim 2, wherein:
the received signal quality measuring section uses a bit error rate as the quality of the received signal; and
when the bit error rate takes on a predetermined reference value or higher, the reference power adjusting section temporarily stops adjusting the reference power.

4. The automatic gain control circuit according to claim 1, wherein in determining (i) whether the quality of the received signal is below the fixed level and (ii) whether the quality of the received signal has recovered to be at the recovery level or above, the reference power adjusting section refers to the threshold, which has hysteresis characteristics.

5. The automatic gain control circuit according to claim 2, wherein in determining (i) whether the quality of the received signal is below the fixed level and (ii) whether the quality of the received signal has recovered to be at the recovery level or above, the reference power adjusting section refers to threshold, which has hysteresis characteristics.

6. The automatic gain control circuit according to claim 1, wherein the reference power adjusting section synchronizes, with the period in which the reference power is adjusted, a symbol period to be measured by the received signal quality measuring section.

7. The automatic gain control circuit according to claim 1, wherein the reference power adjusting section stores a direction in which quality of a received signal improved at a time of previous adjustment, and chooses an initial adjustment direction in accordance with the direction in determining whether to adjust the reference power in an increasing direction or in a decreasing direction.

8. The automatic gain control circuit according to claim 1, wherein upon finding that the receiving apparatus is incapable of receiving a signal, the reference power adjusting section stops adjusting the reference power and provides the amplification degree control section with the predetermined reference power.

9. A receiving apparatus comprising an automatic gain control circuit which includes:
an amplification degree control section for calculating power of a digital value of a received signal, and for controlling an amplification degree of an amplifier of a receiving apparatus so that a difference between the power and predetermined reference power is zero;
a received signal quality measuring section for measuring quality of the received signal;
a reference power adjusting section for, upon finding that the measured quality of the received signal is below a fixed level, adjusting the reference power for a predetermined period of time; and
a reference power updating section for causing the reference power adjusting section to continue to adjust the reference power until the quality of the received signal recovers to be at a predetermined recovery level or above, and for updating the reference power so that the reference power takes on an optimally adjusted value,
wherein the reference power adjusting section reads, as the fixed level and the predetermined recovery level, an individual threshold stored beforehand in accordance with modulation method information or coding rate information extracted from a control signal contained in the received signal, and uses the threshold for determining the quality of the received signal.

10. The receiving apparatus according to claim 9, wherein the received signal quality measuring section uses a modulation error rate as the quality of the received signal.

11. The receiving apparatus according to claim 10, wherein:
the received signal quality measuring section uses a bit error rate as the quality of the received signal; and
when the bit error rate takes on a predetermined reference value or higher, the reference power adjusting section temporarily stops adjusting the reference power.

12. The receiving apparatus according to claim 9, wherein in determining (i) whether the quality of the received signal is below the fixed level and (ii) whether the quality of the received signal has recovered to be at the recovery level or above, the reference power adjusting section refers to the threshold, which has hysteresis characteristics.

13. The receiving apparatus according to claim 10, wherein in determining (i) whether the quality of the received signal is below the fixed level and (ii) whether the quality of the received signal has recovered to be at the recovery level or above, the reference power adjusting section refers to threshold, which has hysteresis characteristics.

14. The receiving apparatus according to claim 9, wherein the reference power adjusting section synchronizes, with the period in which the reference power is adjusted, a symbol period to be measured by the received signal quality measuring section.

15. The receiving apparatus according to claim 9, wherein the reference power adjusting section stores a direction in which quality of a received signal improved at a time of previous adjustment, and chooses an initial adjustment direction in accordance with the direction in determining whether to adjust the reference power in an increasing direction or in a decreasing direction.

16. The receiving apparatus according to claim 9, wherein upon finding that the receiving apparatus is incapable of receiving a signal, the reference power adjusting section stops adjusting the reference power and provides the amplification degree control section with the predetermined reference power.

17. An automatic gain control method comprising:
- an amplification degree control step of calculating power of a digital value of a received signal, and for controlling an amplification degree of an amplifier of a receiving apparatus so that a difference between the power and predetermined reference power is zero;
- a received signal quality measuring step of measuring quality of the received signal;
- a reference power adjusting step of, upon finding that the measured quality of the received signal is below a fixed level, adjusting the reference power for a predetermined period of time; and
- a reference power updating step of causing the reference power adjusting step to continue to adjust the reference power until the quality of the received signal recovers to be at a predetermined recovery level or above, and for updating the reference power so that the reference power takes on an optimally adjusted value,
- wherein the reference power adjusting step includes reading, as the fixed level and the predetermined recovery level, an individual threshold stored beforehand in accordance with modulation method information or coding rate information extracted from a control signal contained in the received signal, and using the threshold for determining the quality of the received signal.

18. A non-transitory computer-readable storage medium having stored thereon an automatic gain control program which when executed causes a computer to function as:
- an amplification degree control section for calculating power of a digital value of a received signal, and for controlling an amplification degree of an amplifier of a receiving apparatus so that a difference between the power and predetermined reference power is zero;
- a received signal quality measuring section for measuring quality of the received signal;
- a reference power adjusting section for, upon finding that the measured quality of the received signal is below a fixed level, adjusting the reference power for a predetermined period of time; and
- a reference power updating section for causing the reference power adjusting section to continue to adjust the reference power until the quality of the received signal recovers to be at a predetermined recovery level or above, and for updating the reference power so that the reference power takes on an optimally adjusted value,
- wherein the reference power adjusting section reads, as the fixed level and the predetermined recovery level, an individual threshold stored beforehand in accordance with modulation method information or coding rate information extracted from a control signal contained in the received signal, and uses the threshold for determining the quality of the received signal.

* * * * *